United States Patent [19]

Okuda et al.

[11] Patent Number: 5,544,776

[45] Date of Patent: Aug. 13, 1996

[54] COMPOSITION IN A LIQUID USED FOR REMOVING A PHOTORESIST FILM AND METHOD THEREFOR

[75] Inventors: Taneaki Okuda; Arata Toyoda, both of Tokyo, Japan

[73] Assignee: NEC Corporation, Tokyo, Japan

[21] Appl. No.: 428,672

[22] Filed: Apr. 25, 1995

[30] Foreign Application Priority Data

Apr. 26, 1994 [JP] Japan .................................. 6-088577

[51] Int. Cl.⁶ ...................................................... B44C 1/22
[52] U.S. Cl. .......................... 216/83; 216/49; 156/655.1; 134/2; 437/229; 252/79.5
[58] Field of Search ................................ 216/41, 49, 83; 156/655.1, 659.11, 661.11; 252/79.1, 79.5; 437/229; 134/2, 29

[56] References Cited

U.S. PATENT DOCUMENTS 4,078,102  3/1978  Bendz et al. ........................ 252/79.5 X

*Primary Examiner*—William Powell
*Attorney, Agent, or Firm*—Young & Thompson

[57] ABSTRACT

The invention provides a method for removing a photoresist from a material comprising the steps of removing the photoresist from the material by use of remover composition comprising a solvent selected from the group consisting of 4-methoxy-1-buanol, 3-methoxy-1-butanol and a mixture thereof and propylene carbonate and rinsing the remover remaining on the device by use of water.

9 Claims, No Drawings

COMPOSITION IN A LIQUID USED FOR REMOVING A PHOTORESIST FILM AND METHOD THEREFOR

BACKGROUND OF THE INVENTION

This invention relates to a composition in a liquid used for removing a photoresist film such as made mainly of a novolak resin from a material and a method therefor in process of fabricating semiconductor integrated circuits and circuit substrates by use of a photoresist as a mask.

Generally, process for fabricating a semiconductor device includes sequential steps like that a photoresist is applied on a device surface to be patterned by exposure through a reticle or a photomask to form a photoresist mask for subsequent etching or ion-implantation process. Thus, the photoresist mask after use must be removed from the processed surface of the device by use of a remover.

The conventional remover for removing the used photoresist from the device is classified to an acid-based remover and an organic-based remover. Piranha where sulfuric acid:hydrogen peroxide=2:1 is a typical example of the former and the remover containing phenol is typical example of the latter. Recently, a remover including aminoethanol has been developed as a remover which belongs to the organic-based remover. This was reported by Laura Peters in SEMICONDUCTOR INTERNATIONAL, FEBRUARY, pages 58 to 64, 1992.

The conventional remover is, however engaged with some disadvantages as follows. Since the acid-based remover has a strong corrosion behavior, it cannot be used in case of contacting it with an aluminum wiring. On the other hand, sulfuric acid and hydrogen peroxide which are compositions of piranha is noxious.

If the remover containing phenol is used for removing the photoresist from the device, a substrate can not directly be rinsed by a pure water just after a step of removing the photoresist because the remover containing phenol is insoluble to water. Thus, it is necessary to rinse the remover remaining the device by use of a chlorophlorocarbon or organic chlorides solvent. After that, it is further necessary to rinse the used chlorophlorocarbon or organic chlorides solvent by methyl ethyl ketone or isopropyl alcohol before a final rinsing is carried out by pure water.

In this case, there are problems like that phenol which shows a strong toxicity of 5 ppm at an acceptable concentration is used and methyl ethyl ketone and isopropyl alcohol which are volatile organopotassium compound causing not only ozone layer destruction but also photochemical oxidant are used and discharged to the outside. In addition, the volatile organopotassium compound has a low flash point, for which there is a serious firehazard in using the volatile organopotassium compound. By the way, the flash points of methyl ethyl ketone and isopropyl alcohol are −5.6° C. and 13° C. respectively.

A remover mainly containing aminoethanol was developed to serve as the above mentioned remover. The remover containing aminoethanol, however, shows a stronger toxicity of 3 ppm at the acceptable concentration than that of phenol. In addition, aminoethanol shows a strong alkaline in aqueous solution, resulting in a corrosion action to metal such as the aluminum wiring formed on the device. Therefore, it is necessary to rinse the remover containing aminoethanol remaining on the device by other chemical substance before rinsing the device by use of pure water.

SUMMARY OF THE INVENTION

Accordingly, it is an object of the invention to provide a novel remover composition for removing a photoresist from material.

It is a further object of the invention to provide a novel remover composition for removing a photoresist from a material, which is superior in safety as compared with the conventional remover containing phenol or aminoethanol.

It is a further object of the invention to provide a novel remover composition for removing a photoresist from a material, which shows no corrosion behavior to metal.

It is a still further object of the invention to provide a novel method for removing a photoresist from a material.

It is a still further object of the invention to provide a novel method for removing a photoresist from a material.

It is a still further object of the invention to provide a novel method for removing a photoresist from a material, in which a remaining part of the remover on the material after removing the photoresist from the material may readily be rinsed by water without use of any chemical substance for rinsing.

The above and other objects, features and advantages of the present invention will be apparent from the following descriptions.

In accordance with the first invention, there is provided a remover composition for removing a photoresist from a material comprising: a solvent selected from the group consisting of 4-methoxy-1-butanol, 3-methoxy-1-butanol and a mixture thereof; and propylene carbonate.

In the first invention, it is preferred that the composition have a flash point of 70° C. or more.

In the first invention, it is preferred that the composition contain 60 to 99 weight percent of the propylene carbonate.

In accordance with the second invention, there is provided a method for removing a photoresist from a material comprising the steps of: removing the photoresist from the material by use of a remover composition comprising a solvent selected from the group consisting of 4-methoxy-1-butanol, 3-methoxy-1-butanol and a mixture thereof and propylene carbonate; and rinsing the remover remaining on the material by use of water.

In the second invention, it is preferred that the composition have a flash point of 70° C. or more.

In the second invention, it is preferred that the composition contain 60 to 99 weight percent of the propylene carbonate.

In the second invention, it is preferred that a temperature of the composition is increased when carrying out the step of removing the photoresist from the material.

In the second invention, it is preferred that the temperature of the composition be increased to less than the flash point of the composition.

In the second invention, it is preferred that the temperature of the composition be increased to the flash point or more of the composition in an inert atmosphere.

PREFERRED EMBODIMENTS OF THE INVENTION

An embodiment according to the invention will be described in the following.

A remover composition comprises a solvent made of 4-methoxy-1-butanol, 3-methoxy-1-butanol or combination of 4-methoxy-1-butanol and 3-methoxy-1-butanol and propylene carbonate. The solvent included in the remover may be a mixture in which each ratio of 4-methoxy-1-butanol and 3-methoxy-1-butanol can be varied in the range of from 0 to 100 weight percent of the solvent.

A flash point of the solvent is generally in the range from 60° to 70° C. (Tag close). If propylene carbonate is gradually added in the solvent, the flash point of the solvent leniently rises up. When the ratio of propylene carbonate is more than 60 weight percent of the remover, then the flash point of the remover rises suddenly but so linearly that the flash point of propylene carbonate approaches to 138° C. (Cleveland open).

Assuming that the temperature in removing the photoresist is constant, the removing action becomes effective as the ratio of the solvent in the remover composition is increased.

On the other hand, when the temperature in removing the photoresist rises, the removing action becomes more effective as compared when increasing the ratio of the solvent in the remover composition as described above.

Therefore, it is preferred that the remover include propylene carbonate in the range of from 60 to 99 weight percent for ensuring the flash point of 70° C. or more. In addition, it is more preferred that the remover includes propylene carbonate in the range from 80 to 99 weight percent for ensuring the flash point of 100° C. or more.

The photoresist to be removed is influenced with a processed hysteresis such as an ion implantation and an etching in the manufacturing processes. Thus, both the temperature for removing the photoresist and the composition of the remover should carefully be instituted on the basis of an actual state of the photoresist. For instance, the surface of the photoresist is carbonized and hardened as an ion concentration to be implanted thereinto is increased, so that it is general that the hardened surface layer of the photoresist is previously removed by dry etching such as oxygen plasma method. If the hardened surface layer of the photoresist is removed, then the temperature for effectively removing the photoresist may be less than 70° C. Otherwise, if the hardened surface layer of the photoresist remains on the photoresist, the effective removing action may be obtained at 70° C. or more.

Next, a method for removing the photoresist from a material such as a semiconductor wafer and the like will be described in the following.

The method of the present invention comprises the step of removing the photoresist from the article by use of the remover and rinsing the remover leaving on the article by use of the pure water just after removing the photoresist. This method is concretely described with reference to the following examples and comparative example.

EXAMPLE 1

The remover composition to be used in the example 1 comprises a solvent made of 4-methoxy-1-butanol, 3-methoxy-1-butanol or a mixture of 4-methoxy-1-butanol with 3-methoxy-1-butanol and propylene carbonate. A first bath for washing to the device is used to remove the photoresist by use of the remover. A second bath is used for rinsing the used remover from the semiconductor device by use of pure water. A third bath is used for finally rinsing the remover from the semiconductor device by use of pure water.

The photoresist on the device is immersed in the first bath filled with a washing liquid containing the remover to remove the photoresist from the device. The semiconductor device from which the photoresist was already removed is then immersed in the second bath filled with pure water to rinse the used remover by pure water or to remove the used remover remaining on the device. The semiconductor device is thereafter immersed in the third bath filled with pure water to further rinse a still remaining part of the rinsed remover by pure water to remove the remover completely.

EXAMPLE 2

A silicon wafer is prepared as a sample for the example 2. In the sample wafer, an oxynitride film as an insulation film is formed on the wafer, after which a positive type photoresist containing novolak of OFPR-800 type commercially available from Tokyo Oka is applied on the oxynitride film by use of the spin coating. The wafer is previously baked at 90° C. for 30 minutes and subjected to patterning. Subsequently, the wafer is rinsed by pure water and again baked at 135° C. for 30 minutes. After that, the insulation film is removed by use of the dry etching for forming through holes to obtain the sample wafer.

The sample wafer is immersed in the first bath filled with a remover which comprises propylene carbonate and includes 4-methoxy-1-butanol of 25 weight percent of the remover, in which the temperature of the remover is increased up to 90° C. to give the wafer a shake in the first bath for 10 minutes. As a result, the photoresist is washed to be removed from the wafer. After that, the wafer is immersed in the second bath filled with pure water to rinse the remover remaining on the wafer for 5 minutes. It was observed that the photoresist was completely removed from the wafer and the through hole satisfactorily is formed in the sample wafer. Further, the flash point of the remover is 93° C. (Cleveland open).

EXAMPLE 3

A silicon wafer is prepared as a sample. A silicon aluminum alloy film is formed on the wafer by use of sputtering method. In the same way as the above example 2, the photoresist is applied on the silicon aluminum alloy film by use of the spin coating method. The wafer is previously baked at 90° C. for 30 minutes and subjected to patterning. Subsequently, the wafer is rinsed by pure water and again baked at 135° C. for 30 minutes. After that, the silicon aluminum alloy film is removed by use of the dry etching to obtain the sample wafer. In addition, the surface of the photoresist is removed by the oxygen plasma method since the surface is hardened on account of the above processes.

The sample wafer is immersed in the first bath filled with a remover which comprises propylene carbonate and includes 4-methoxy-1-butanol of 15 weight percent of the remover, in which the temperature of the remover is increased to 100° C. to give the wafer a shake in the first bath for 5 minutes. As a result, the photoresist is washed to be removed from the wafer. After that, the wafer is immersed in the second bath filled with pure water to rinse the remover remaining on the wafer for 5 minutes. It is observed that the photoresist is completely removed from the wafer and aluminum wiring is satisfactory formed on the sample wafer.

Further, in the embodiment 3, the flash point of the remover is 110° C. (Cleveland open) and if 3-methoxy-1-butanol is used as composition of the remover, it is obtained almost the same effect as using 4-methoxy-1-butanol.

Comparative Example 1

In Comparative Example 1, a remover bath filled with remover containing phenol, a strip rinse liquid bath, first and second rinse bath for rinsing the strip rinse liquid and third rinse bath are used.

The remover containing phenol is used for removing the photoresist from the device and chlorophlorocarbon and methylchloroform are used as the strip rinse liquid after removing the photoresist. Those liquid is, however, insoluble to water so that the sample wafer is immersed in the first and second rinse baths for rinsing the strip rinse liquid by methyl ethyl ketone or isopropyl alcohol. After that, the wafer is immersed in the third bath for rinsing by pure water.

As described above, according to the invention, the remover can be rinsed directly by water after finishing the step of removing the photoresist. Therefore, a simple method for removing the photoresist is obtained, and the amount of waste liquid disposal and the load to the environment can be reduced because of no use of any chemical substance for rinsing. Namely, as the remover of the invention is used for removing the photoresist from the device, the method for removing the photoresist is allowed to comprise the two steps only for example, removing the photoresist and rinsing the remover.

In addition, 4-methoxy-1-butanol, 3-methoxy-1-butanol and propylene carbonate comprising of the remover of the invention show weak toxicity as compared with phenol and aminoethanol, so that the method of the invention can be carried out safety. Since the remover comprising the above composition has no corrosion action to metal, the remover can be used to the wafer having a metal wiring thereon which is exposed to the remover in the step of removing the photoresist. Thus, the remover and the method for removing the photoresist of the invention can be adopted any device to be subjected to patterning by use of the photoresist.

Furthermore, according to the invention, if the remover is increased to 70° C. or more, then the excellent effect of removing the photoresist from the device is obtainable. In addition, if the step of removing the photoresist from the article is carried out in an inert atmosphere such as nitrogen, argon and carbon dioxide, then the step can be carried out at more than flash point of the remover of the invention, resulting in a further excellent effect of removing the photoresist from the device Whereas modifications of the present invention will no doubt be apparent to a person of ordinary skilled in the art to which the invention pertains, it is to be understood that the embodiments shown and described by way of illustration are by no means intended to be considered in a limiting sense. Accordingly, it is to be intended by the claims to cover all modifications of the invention which fall within the spirit and scope of the invention.

What is claimed is:

1. A remover composition for removing a photoresist from a material comprising:

a solvent selected from the group consisting of 4-methoxy-1-butanol, 3-methoxy-1-butanol and a mixture thereof; and propylene carbonate.

2. A remover composition according to claim 1, wherein said composition has a flash point of 70° C. or more.

3. A remover composition according to claim 1, wherein said composition contains 60 to 99 weight percent of said propylene carbonate.

4. A method for removing a photoresist from a material comprising the steps of:

removing said photoresist from said material by use of a remover composition comprising a solvent selected from the group consisting of 4-methoxy-1-butanol, 3-methoxy-1-butanol and a mixture thereof and propylene carbonate; and rinsing said remover remaining on said material by use of water.

5. A method for removing a photoresist from a material according to claim 4, wherein said composition has a flash point of 70° C. or more.

6. A method for removing a photoresist from a material according to claim 4, wherein said composition contains 60 to 99 weight percent of said propylene carbonate.

7. A method for removing a photoresist from a material according to claim 4, wherein a temperature of said composition is increased when carrying out said step of removing said photoresist from said material.

8. A method for removing a photoresist from a material according to claim 7, wherein said temperature of said composition is increased to less than said flash point of said composition.

9. A method for removing a photoresist from a material according to claim 7, wherein said temperature of said composition is increased to said flash point or more of said composition in an inert atmosphere.

* * * * *